United States Patent
Cheong

(10) Patent No.: US 9,115,425 B2
(45) Date of Patent: Aug. 25, 2015

(54) THIN FILM DEPOSITING APPARATUS

(75) Inventor: Woo-Seok Cheong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 1051 days.

(21) Appl. No.: 13/182,590

(22) Filed: Jul. 14, 2011

(65) Prior Publication Data

US 2012/0090543 A1    Apr. 19, 2012

(30) Foreign Application Priority Data

Oct. 18, 2010 (KR) .................. 10-2010-0101510
Dec. 21, 2010 (KR) .................. 10-2010-0131427

(51) Int. Cl.
| C23C 16/44 | (2006.01) |
| B25J 18/00 | (2006.01) |
| B25J 15/06 | (2006.01) |
| C23C 16/458 | (2006.01) |
| H01L 21/677 | (2006.01) |
| C23C 14/34 | (2006.01) |
| C23C 14/56 | (2006.01) |
| H01L 21/67 | (2006.01) |

(52) U.S. Cl.
CPC ............. *C23C 16/4587* (2013.01); *C23C 14/34* (2013.01); *C23C 14/568* (2013.01); *H01L 21/6776* (2013.01); *H01L 21/67173* (2013.01); *H01L 21/67712* (2013.01); *H01L 21/67718* (2013.01); *H01L 21/67751* (2013.01)

(58) Field of Classification Search
CPC ................... C23C 16/4587; H01L 21/67712; H01L 21/67751
USPC ................................... 118/718, 719
See application file for complete search history.

(56) References Cited

U.S. PATENT DOCUMENTS

| 4,749,465 A * | 6/1988 | Flint et al. ............... 204/298.25 |
| 5,743,965 A * | 4/1998 | Nishimura et al. ........... 118/712 |
| 2005/0115830 A1* | 6/2005 | Furukawa et al. ....... 204/298.25 |
| 2006/0021576 A1* | 2/2006 | Nolan et al. .................. 118/719 |
| 2007/0181421 A1* | 8/2007 | Wei et al. ................. 204/298.02 |

FOREIGN PATENT DOCUMENTS

| KR | 1998-0071719 A | 2/1998 |
| KR | 10-0234539 B | 12/1999 |
| KR | 10-0277321 B1 | 10/2000 |
| KR | 10-0722781 B | 5/2007 |
| KR | 2007-0063930 A | 6/2007 |
| KR | 10-0998057 B1 | 11/2010 |

OTHER PUBLICATIONS

Ulf Helmersson, et al., "Ionized physical vapor deposition (IPVD): A review of technology and applications", Thin Solid Films vol. 513, No. 1-2, Aug. 14, 2006, pp. 1-24.

* cited by examiner

*Primary Examiner* — Parviz Hassanzadeh
*Assistant Examiner* — Nathan K Ford
(74) *Attorney, Agent, or Firm* — Rabin & Berdo, P.C.

(57) ABSTRACT

Provided is a thin film depositing apparatus. The thin film depositing apparatus includes: a loading chamber loading a plurality of substrates; a first process chamber connected to the loading chamber and including a plurality of sputter guns inducing a first plasma on the plurality of substrates; a buffer chamber connected to the other side of the first process chamber facing the loading chamber; and a substrate transfer module simultaneously passing the plurality of substrates between the plurality of sputter guns during a process using the first plasma and transferring the plurality of substrates from the first process chamber to the buffer chamber.

8 Claims, 7 Drawing Sheets

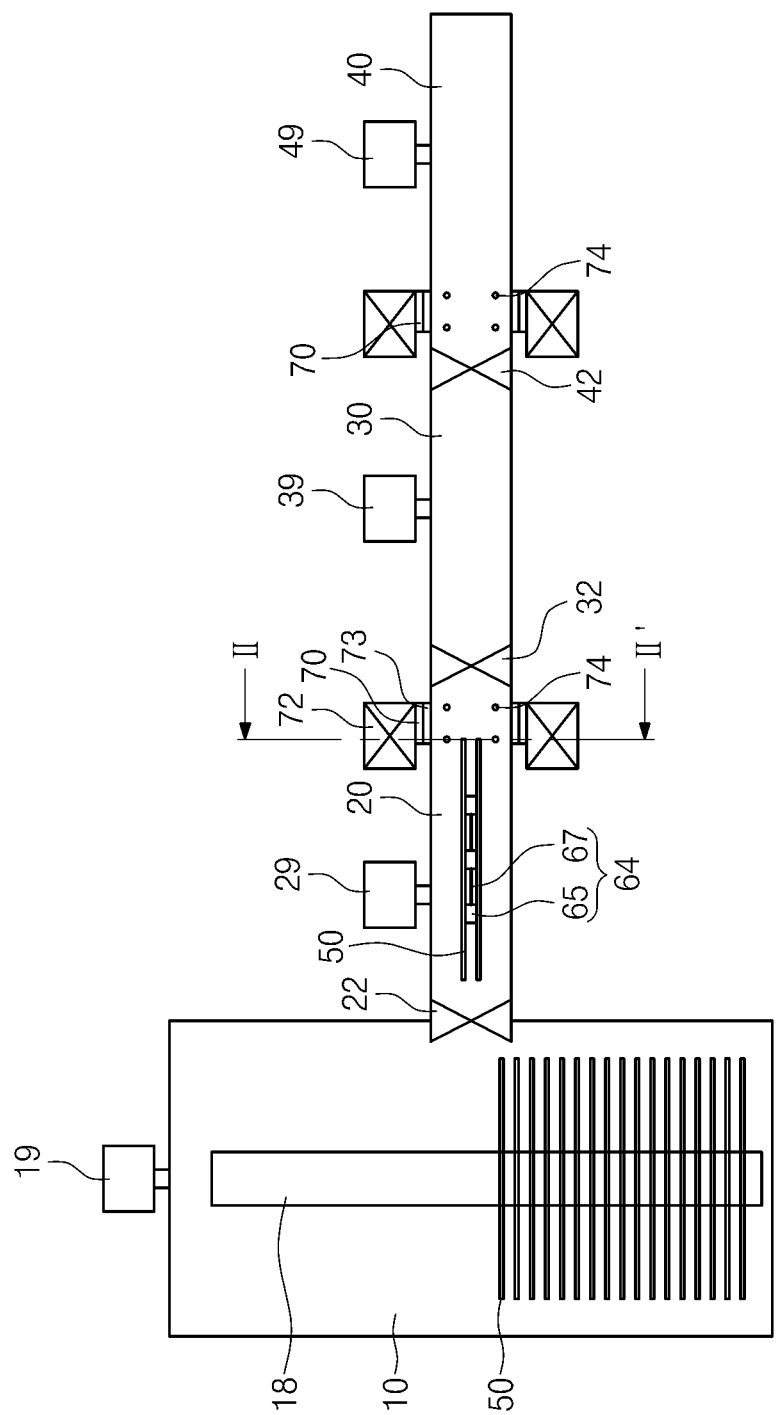

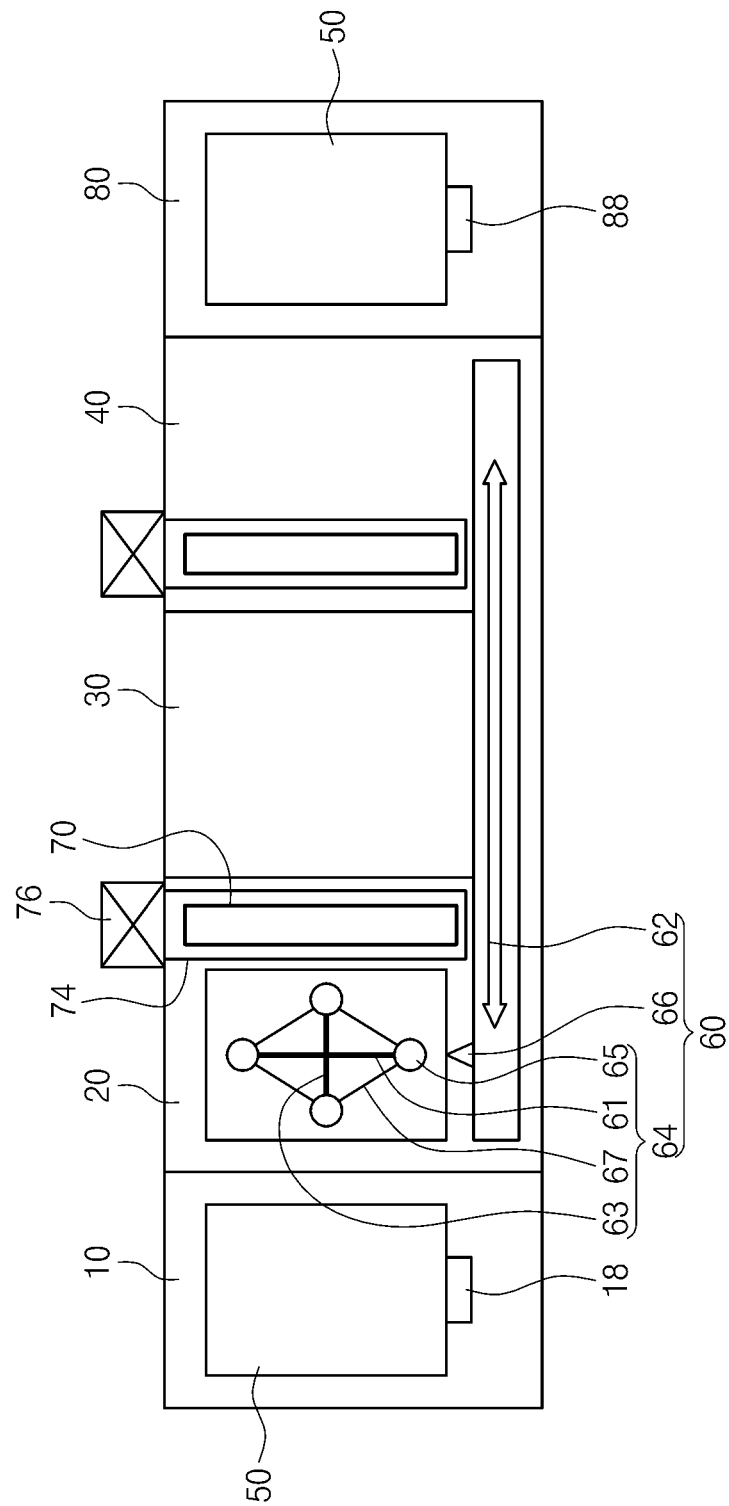

THIN FILM DEPOSITING APPARATUS

CROSS-REFERENCE TO RELATED APPLICATIONS

This U.S. non-provisional patent application claims priority under 35 U.S.C. §119 of Korean Patent Application No. 10-2010-0101510, filed on Oct. 18, 2010 and 10-2010-0131427, filed on Dec. 21, 2010, the entire contents of which are hereby incorporated by reference.

BACKGROUND OF THE INVENTION

The present invention disclosed herein relates to a thin film depositing apparatus, and more particularly, to a thin film depositing apparatus depositing a thin film on a film or a flat plate.

A high-performance thin film becomes greatly utilized because of development of electronic communication technology. Moreover, Research and Development (R&D) for mass production of the high-performance thin film is actively in progress. A typical thin film depositing apparatus may include a cluster type multi sputtering system. In relation to the cluster type sputtering system, a plurality of process chambers may be disposed with a shape of a square, a pentagon, a hexagon, or an octagon around one transfer chamber through a centralized scheme. The transfer chamber may include a robot arm transferring a substrate by the piece to the process chamber. However, since the typical cluster type sputtering system needs to sequentially perform a process of a single substrate, its productivity may be reduced.

SUMMARY OF THE INVENTION

The present invention provides a thin film depositing apparatus simultaneously performing thin film depositing processes of a plurality of substrates.

The present invention also provides a thin film depositing apparatus increasing or maximizing productivity.

Embodiments of the present invention provide thin film depositing apparatuses including: a loading chamber loading a plurality of substrates; a first process chamber connected to the loading chamber and including a plurality of sputter guns inducing a first plasma on the plurality of substrates; a buffer chamber connected to the other side of the first process chamber facing the loading chamber; and a substrate transfer module simultaneously passing the plurality of substrates between the plurality of sputter guns during a process using the first plasma and transferring the plurality of substrates from the first process chamber to the buffer chamber.

In some embodiments, the substrates transfer module may include a guide rail connected from the first process chamber to the buffer chamber, at least one robot arm grabbing the plurality of substrates, and a supporter transferring the robot arm and the plurality of substrates along the guide rail.

In other embodiments, the robot arm may include a vertical arm and a horizontal arm moving the plurality of substrates vertically and horizontally on the supporter, suction plates suctioning the plurality of substrates at the end of each of the vertical arm and the horizontal arm, and vacuum pipes connected to between the suction plates.

In still other embodiments, the suction plates may include suckers suctioning the plurality of substrates using a vacuum pressure provided from the vacuum pipes.

In even other embodiments, the thin film depositing apparatuses may further include a second process chamber connected to the other side of the buffer chamber facing the first process chamber.

In yet other embodiments, the thin film depositing apparatuses may further include an unloading chamber at the other side of the second process chamber facing the buffer chamber.

In further embodiments, the thin film depositing apparatuses may further include a cassette loading the plurality of substrates in each of the unloading chamber and the loading chamber.

In still further embodiments, the thin film depositing apparatuses may further include a loader and an unloader moving horizontally the plurality of substrates loaded in the cassette in the loading chamber and the unloading chamber and loading and unloading the plurality of substrates using the robot arm.

In even further embodiments, the first process chamber may further include a plurality of inductive coupled plasma tubes inducing a second plasma that is more expanded than the first plasma between the plurality of sputter guns and the plurality of substrates.

In yet further embodiments, the plurality of sputter guns and the plurality of inductive coupled plasma tubes may be disposed adjacent to the buffer chamber in the first process chamber.

In yet further embodiments, the thin film depositing apparatus may further include a first gate valve between the loading chamber and the first process chamber and a second gate valve between the first process chamber and the buffer chamber.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2 and 3 are a side view and a plan view, respectively, taken along the line I-I' of FIG. 1;

FIGS. 5 and 6 are a side view and a plan view, respectively, of a thin film depositing apparatus according to another embodiment of the present invention.

DETAILED DESCRIPTION OF PREFERRED EMBODIMENTS

Figure 1:
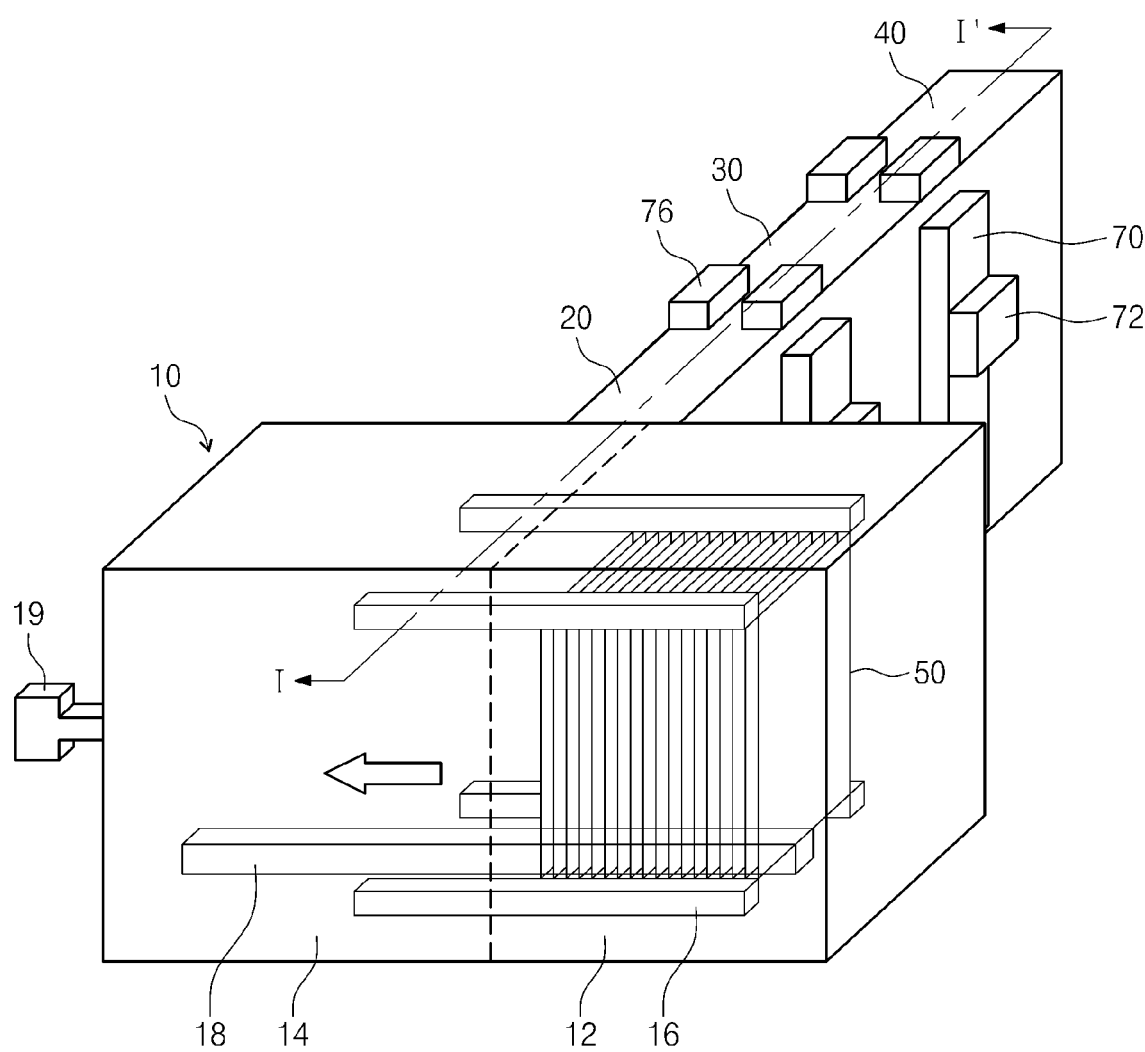
FIG. 1 is a perspective view illustrating a thin film depositing apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

While specific terms were used, they were not used to limit the meaning or the scope of the present invention described in Claims, but merely used to explain the present invention. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Figure 2:
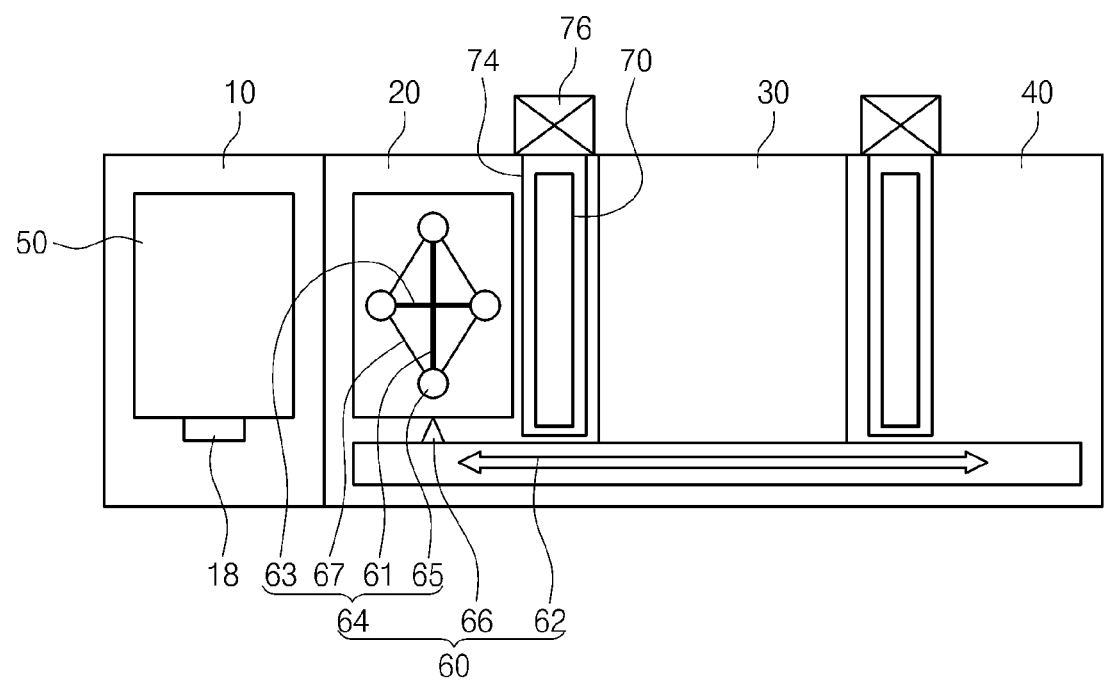
Figure 4A:
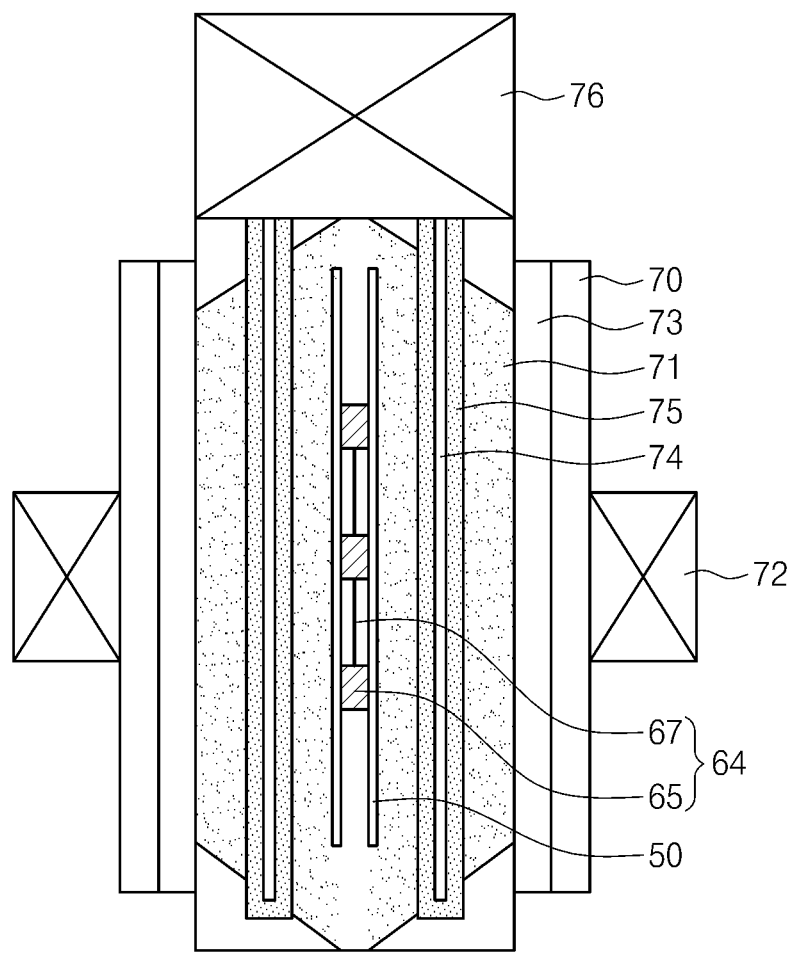
FIG. 4A is a sectional view taken along the line II-II' of FIG. 3 illustrating sputtering guns and inductive coupled plasma tubes in more detail.
Figure 4B:
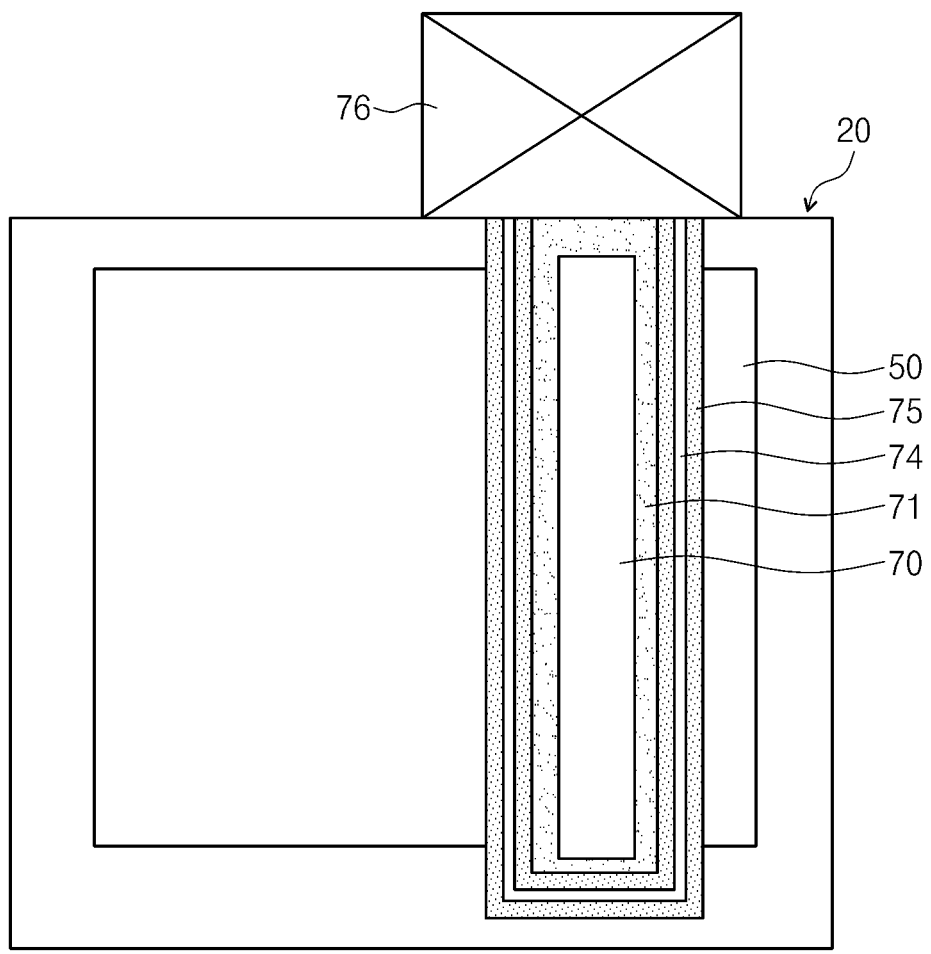
FIG. 4B is a side view of the sputtering gun and the inductive coupled plasma tubes.

FIG. 1 is a perspective view illustrating a thin film depositing apparatus according to an embodiment of the present invention. FIGS. 2 and 3 are a side view and a plan view, respectively, taken along the line I-I' of FIG. 1. FIG. 4A is a sectional view taken along the line II-II' of FIG. 3 illustrating sputtering guns and inductive coupled plasma tubes in more detail. FIG. 4B is a side view of the sputtering gun and the inductive coupled plasma tubes.

Referring to FIGS. 1 through 4B, the thin film depositing apparatus according to an embodiment of the present invention includes a first process chamber 20, a buffer chamber 30, and a second process chamber 40 disposed sequentially at one side of a loading chamber 10 and a substrate transfer module 60 transferring a plurality of substrates 50 between the first process chamber 20 and the second process chamber 40. The first and second process chambers 20 and 40 may include a plurality of sputter guns 70 and inductive coupled plasma tubes 74. The substrate transfer module 60 may simultaneously transfer the plurality of substrates 50 during a process such as a thin film depositing process of the first and second process chambers 20 and 40. The plurality of sputter guns 70 and inductive coupled plasma tubes 74 may include first and second plasmas 71 and 75 at the outer side of the plurality of substrates 50.

Accordingly, the thin film depositing apparatus according to an embodiment of the present invention may increase or maximize productivity because thin film depositing processes of the plurality of substrate 50 are performed simultaneously.

The loading chamber 10 may receive a cassette 16 where the plurality of substrates 50 are loaded. The cassette 16 may load the plurality of substrate 50 vertically. The loading chamber 10 may include a substrate loading region 12 and a substrate unloading region 14. The loader 18 may transfer the plurality of substrates 50 horizontally between the loading region 12 and the substrate unloading region 14. A robot arm 64 may load or unload the plurality of substrates 50 into or from the loader 18. The inside of the loading chamber 10 may maintain a predetermined vacuum pressure through pumping of a first vacuum pump 19.

A first process of the plurality of substrates 50 transferred in the loading chamber 10 may be performed in the first process chamber 20. A first gate valve 22 may be disposed between the first process chamber 20 and the loading chamber 10. The first gate valve 22 may become closed when an input of the plurality of substrates 50 is completed in the first process chamber 20. The first process chamber may be connected to a second vacuum pump 29 maintaining its inside to be a vacuum pressure of about 0.1 mTorr to about 100 mTorr. Additionally, the first process chamber 20 may be filled with an inert gas such as Ar, which is a source gas of the first plasma 71.

The substrate transfer module 60 may transfer the plurality of substrates 50 from the loading chamber 10 to the first process chamber 20. The substrate transfer module 60 may include a guide rail 62 connected from the first process chamber 20 to the second process chamber 40 through the buffer chamber 30, the robot arm 64 grabbing the plurality of substrates 50, and a supporter supporting the robot arm 64 and moving along the guide rail 62. The robot arm 64 may transfer the plurality of substrates 50 between the first process chamber 200 and the loading chamber 10. For example, the robot arm 64 may grab the plurality of substrates 50 on the loader 18 in the loading chamber 10 and move them on the supporter 66.

The robot arm 64 may include a vertical arm 61 and a horizontal arm 63 moving the plurality of substrates 50 vertically and horizontally, suction plates suctioning the plurality of substrates 50 at the end of each of the vertical arm 61 and the horizontal arm 63, and vacuum pipes 67 connected to between the suction plates 65. Each of the vertical arm 61 and the horizontal arm 63 may include a shaft. The vacuum pipes 67 may provide a predetermined a vacuum pressure. The suction plates 65 may suction the facing both sides of the plurality of substrates 50 through a vacuum pressure provided from the vacuum pipes 67. The suction plates 65 may include a plurality of suckers formed in respectively facing directions.

Moreover, the plurality of sputter guns 70 and the plurality of inductive coupled plasma tubes 74 may be disposed on the facing sidewalls at the both sides of the first process chamber 20. The plurality of sputter guns 70 and inductive coupled plasma tubes 74 may be disposed adjacent to the second gate valve 32 and the buffer chamber 30. The plurality of substrates 50 may respectively pass through between the plurality of sputter guns 70 and inductive coupled plasma tubes 74 by the substrate transfer module 60.

The plurality of sputter guns 70 may induce the first plasma 71 through a first high frequency power supplied from a first matching box 72. The plurality of sputter guns 70 may have a width of about 5 cm to about 20 cm and a length of about 30 cm to about 300 cm. Targets 73 may be disposed on the plurality of sputter guns 70. For example, the targets 73 may include metals such as tungsten, aluminum, titanium, cobalt, nickel, molybdenum and a ceramic of a silicon oxide layer. The first high frequency power applied to the plurality of sputter guns 70 may charge an inert gas such as Ar into a positive ion of a plasma state through the plurality of sputter guns 70.

The inert gas of a plasma state may be sputtered into the targets 73. The first plasma 71 may sputter deposition particles constituting a thin film on the plurality of substrates 50, from the targets 73. At this point, the first plasma 71 may be constrained between the plurality of inductive coupled plasma tubes 74.

The plurality of inductive coupled plasma tubes 74 may induce a second plasma 75 through a second high frequency power supplied from a second matching box 76. The plurality of inductive coupled plasma tubes 74 may be disposed in a parallel direction to the plurality of substrates 50. The plurality of inductive coupled plasma tubes 74 may include a rod electrode. The rode electrode may include a coil to which the second high frequency power is applied and a cover of a glass material surrounding the coil.

The plurality of inductive coupled plasma tubes 74 may guide the first plasma 71. The first plasma 71 may be induced between the plurality of inductive coupled plasma tubes 74. Accordingly, the second plasma 75 may be induced from a broader area than the first plasma 71. The second plasma 75 may uniformly mix the sputtered deposition particles. The second plasma 75 may increase an ionization rate of an inert gas charged from the first plasma 71. Accordingly, a uniform and dense thin film may be formed on the plurality of substrates 50.

The buffer chamber 30 may be connected to the other side of the first process chamber 20 facing the loading chamber 10. An opening and closing second gate valve 32 may be disposed between the buffer chamber 30 and the first process chamber 20. The second gate valve 32 may be opened while the plurality of substrates 50 are processed in the first process chamber 20. Moreover, the second gate value 32 may be opened while the plurality of substrates 50 transfer from the buffer chamber 30 to the first process chamber 20. The buffer chamber 30 may maintain a vacuum pressure of about 0.1 mTorr to about 100 mTorr through pumping provided from a third vacuum pump 39.

The second process chamber 40 may be connected to the other side of the buffer chamber 30 facing the first process chamber 20. A third gate valve 42 may be disposed between the second process chamber 40 and the buffer chamber 30. The third gate valve 42 may be opened when the plurality of substrates 50 transfer between the second process chamber 40 and the buffer chamber 30. A second process of the plurality of substrates 50 may be performed in the second process chamber 40. The second process chamber 40 may deposit a different thin film than that deposited in the first process chamber 20 on the plurality of substrates 50.

The second process chamber 40 may maintain a vacuum pressure of about 0.1 mTorr to about 100 mTorr through pumping provided from a fourth vacuum pump 49. The plurality of sputter guns 70 and inductive coupled plasma tubes 74 may be disposed in the second process chamber 40. The plurality of sputter guns 70 and inductive coupled plasma tubes 74 may be disposed adjacent to the third gate valve 42 and the buffer chamber 30. As mentioned above, the plurality of sputter guns 70 and inductive coupled plasma tubes 74 may induce the first plasma 71 and the second plasma 75, respectively. Accordingly, while the plurality of substrates 50 may transfer from the buffer chamber 30 to the second process chamber 40, a thin film is deposited thereon. The plurality of substrates 50 return to the loading chamber 10 through the buffer chamber 30 and the first process chamber 20 using the substrate transfer module 60 once a second process is completed in the second process chamber 40. After this, the plurality of substrates 50 may be loaded into the cassette 16 again in the loading chamber 10.

Other buffer chambers and process chambers may be sequentially connected to the other side of the second process chamber 40 facing the buffer chamber 30.

Accordingly, since the thin film depositing apparatus according to embodiments of the present invention may simultaneously perform a thin film depositing process of the plurality of substrates 50, productivity may be increased or maximized.

Figure 6:
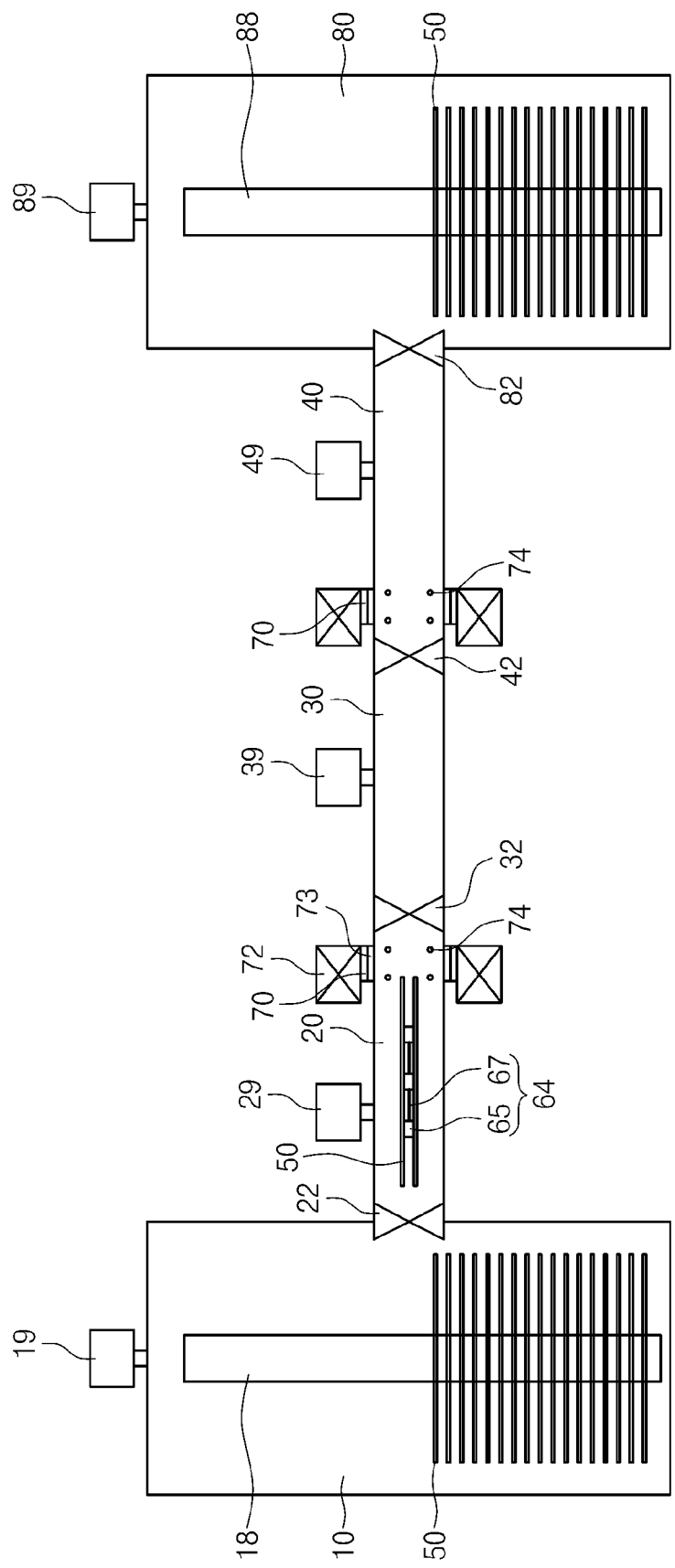

FIGS. 5 and 6 are a side view and a plan view, respectively, of a thin film depositing apparatus according to another embodiment of the present invention.

Referring to FIGS. 5 and 6, the thin film depositing apparatus according to another embodiment of the present invention includes a loading chamber 10, an unloading chamber 80, a first process chamber 20, a buffer chamber 30, and a second process chamber 40. The chambers 20, 30, and 40 are connected in a row between the loading chamber 10 and the unloading chamber 80. A substrate transfer module 60 may transfer a plurality of substrates 50 from the loading chamber 10 to the unloading chamber 30. The substrate transfer module 60 may simultaneously transfer the plurality of substrates 50 between the first process chamber 20, the buffer chamber 30, and the second process chamber 40. Respectively different thin films may be simultaneously formed on the plurality of substrates 50 in each of the first process chamber 20 and the second process chamber 40.

Accordingly, the thin film depositing apparatus according to another embodiment of the present invention may simultaneously perform a thin film depositing process of the plurality of substrates 50, productivity may be increased or maximized.

A robot arm 64 of the substrate transfer module 60 loads the plurality of substrate 50 from a loader 18 in the loading chamber 10 and unloads them into the unloader 88 in the unloading chamber 80. The loader 18 and the unloader 88 may move the plurality of substrates 50 in an opposite direction.

The robot arm 64 may move along the guide rail 62. The plurality of substrates 50 may be mounted on the robot arm 64 and the supporter 66 of the substrate transfer module 60. The plurality of substrates 50 may be sequentially transferred to the first process chamber 20, the buffer chamber 30, and the second process chamber 40. Thin films may be simultaneously deposited on the plurality of substrates 50 in the first process chamber 20 through the first plasma 71 induced from a plurality of sputter guns 70. Additionally, other thin films may be simultaneously deposited on the plurality of substrates 50 in the second process chamber 40 through the first plasma 71.

As a result, since the thin film depositing apparatus according to embodiments of the present invention may simultaneously perform a thin film depositing process of the plurality of substrates 50, productivity may be increased or maximized.

As mentioned above, according to an embodiment of the present invention, a loading chamber, a process chamber, and a buffer chamber may be linearly disposed. A substrate transfer module may simultaneously transfer a plurality of substrates from the loading chamber to the buffer chamber. A plurality of sputter guns inducing a first plasma may be disposed on the facing sidewalls at the both sides of the process chamber. The substrate transfer module simultaneously transfer a plurality of substrates to between the plurality of sputter guns during a thin film depositing process using the first plasma induced from the plurality of sputter guns. Therefore, since a thin film depositing apparatus according to embodiments of the present invention may simultaneously perform a thin film depositing process of a plurality of substrates, productivity may be increased or maximized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A thin film depositing apparatus comprising:
   a loading chamber loading a plurality of substrates;
   a first process chamber connected to the loading chamber to receive the substrates and including a plurality of sputter guns inducing a first plasma;
   a buffer chamber connected to a side of the first process chamber opposite to and facing the loading chamber; and
   a substrate transfer module including
      a guide rail connecting the first process chamber and the buffer chamber,
      a robot arm having a vertical arm and a horizontal arm,
      suction plates comprising suckers which are attached at both of an end of the vertical arm and an end of the horizontal arm,
      vacuum pipes connected to and between the suction plates, and
      a supporter transferring the vertical arm and the horizontal arm along the guide rail, wherein the robot arm transfers a first of the substrates and a second of the substrates along the guide rail to pass the first and second substrates between the plurality of sputter guns during a process using the first plasma while the first and second substrates are oriented uprightly and in parallel to each other, wherein the first substrate has a surface facing a surface of the second substrate, and during the process using the first plasma each of the suckers directly grips, using vacuum pressure provided from the vacuum pipes, said surface of the first substrate and said surface of the second substrate so that the first and second substrates are oriented uprightly and in parallel to each other, further wherein the substrate transfer module transfers the first and second substrates from the first process chamber to the buffer chamber.

2. The thin film depositing apparatus of claim 1, further comprising a second process chamber connected to a side of the buffer chamber opposite to and facing the first process chamber.

3. The thin film depositing apparatus of claim 2, further comprising an unloading chamber at a side of the second process chamber opposite to and facing the buffer chamber.

4. The thin film depositing apparatus of claim 3, further comprising cassettes loading the plurality of substrates in each of the unloading chamber and the loading chamber.

5. The thin film depositing apparatus of claim 4, further comprising:
   a loader; and
   an unloader,
   the loader and the unloader moving horizontally the plurality of substrates loaded in the cassettes in the loading chamber and the unloading chamber and loading and unloading the plurality of substrates using the robot arm.

6. The thin film depositing apparatus of claim 1, wherein the first process chamber further comprises a plurality of inductive coupled plasma tubes inducing a second plasma that is more expanded than the first plasma between the plurality of sputter guns and the plurality of substrates.

7. The thin film depositing apparatus of claim 6, wherein the plurality of sputter guns and the plurality of inductive coupled plasma tubes are disposed adjacent to the buffer chamber in the first process chamber.

8. The thin film depositing apparatus of claim 1, further comprising:
   a first gate valve between the loading chamber and the first process chamber; and
   a second gate valve between the first process chamber and the buffer chamber.

* * * * *